United States Patent
Chen

(10) Patent No.: US 9,449,966 B2
(45) Date of Patent: Sep. 20, 2016

(54) THREE-DIMENSIONAL SEMICONDUCTOR DEVICE AND METHOD OF MANUFACTURING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/596,257

(22) Filed: Jan. 14, 2015

(65) Prior Publication Data

US 2016/0204102 A1    Jul. 14, 2016

(51) Int. Cl.
| | |
|---|---|
| H01L 23/528 | (2006.01) |
| H01L 27/115 | (2006.01) |
| H01L 27/06 | (2006.01) |
| H01L 27/02 | (2006.01) |
| H01L 21/768 | (2006.01) |

(52) U.S. Cl.
CPC ..... H01L 27/0688 (2013.01); H01L 21/76877 (2013.01); H01L 23/528 (2013.01); H01L 27/0207 (2013.01); H01L 27/11551 (2013.01); H01L 27/11578 (2013.01)

(58) Field of Classification Search
None
See application file for complete search history.

(56) References Cited

U.S. PATENT DOCUMENTS

| | | | |
|---|---|---|---|
| 8,383,512 B2 | 2/2013 | Chen et al. | |
| 8,541,882 B2 | 9/2013 | Chen et al. | |
| 8,598,032 B2 | 12/2013 | Chen et al. | |
| 8,633,099 B1 | 1/2014 | Shih et al. | |
| 8,759,217 B1 | 6/2014 | Chen | |
| 2012/0181701 A1* | 7/2012 | Chen | H01L 23/50 257/774 |
| 2012/0280299 A1* | 11/2012 | Yun | H01L 27/1157 257/314 |
| 2015/0069616 A1* | 3/2015 | Oh | H01L 23/48 257/773 |

FOREIGN PATENT DOCUMENTS

| | | |
|---|---|---|
| TW | 201232701 A1 | 8/2012 |
| WO | 2014130413 A1 | 8/2014 |

* cited by examiner

*Primary Examiner* — Johannes P Mondt
(74) *Attorney, Agent, or Firm* — McClure, Qualey & Rodack, LLP

(57) ABSTRACT

A three-dimensional (3D) semiconductor device is provided, comprising a substrate having a staircase region comprising N steps, wherein N is an integer one or greater; a stack having multi-layers on the substrate, and the multi-layers comprising active layers alternating with insulating layers on the substrate, the stack comprising a plurality of sub-stacks formed on the substrate and the sub-stacks disposed in relation to the N steps to form respective contact regions; and a plurality of connectors formed in the respective contact regions, and the connectors extending downwardly to connect a bottom layer under the multi-layers.

20 Claims, 16 Drawing Sheets

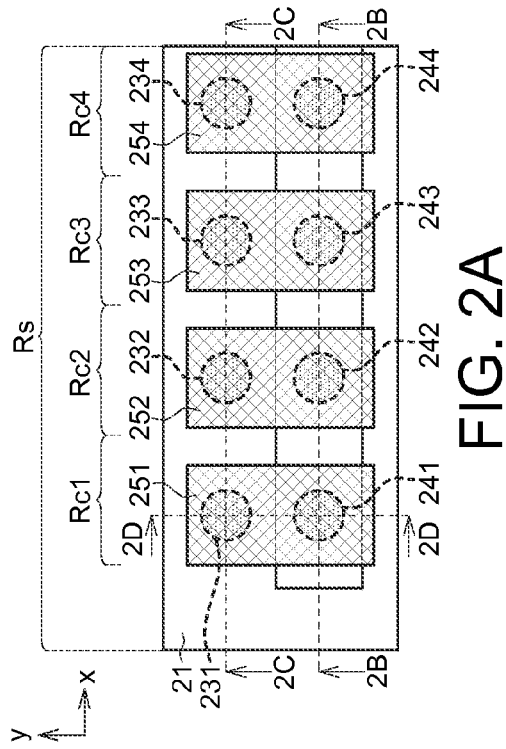
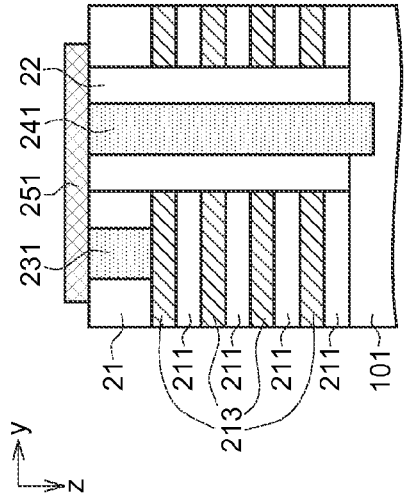
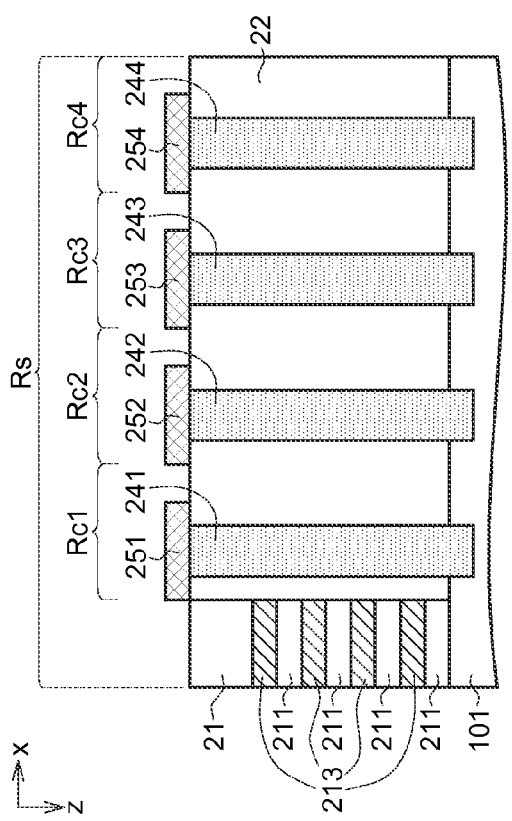
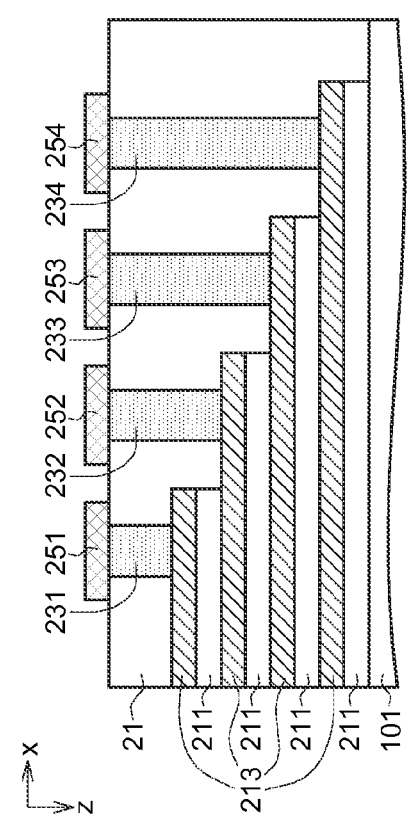
FIG. 2A
FIG. 2B
FIG. 2C
FIG. 2D

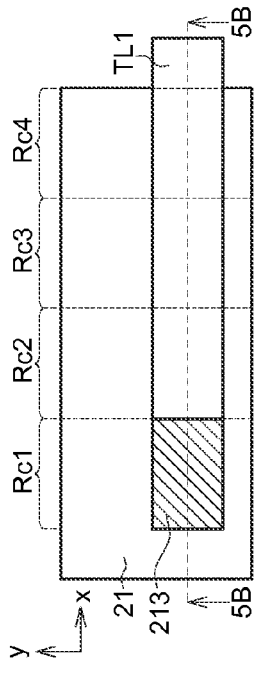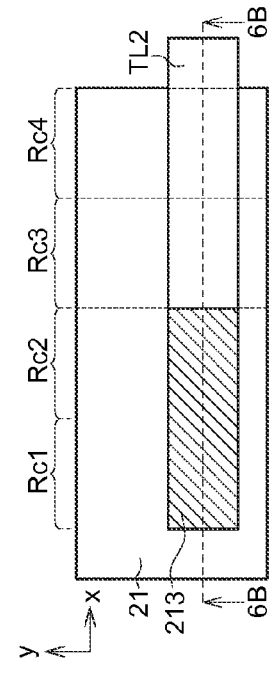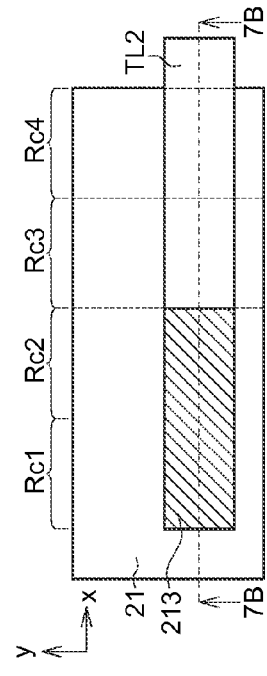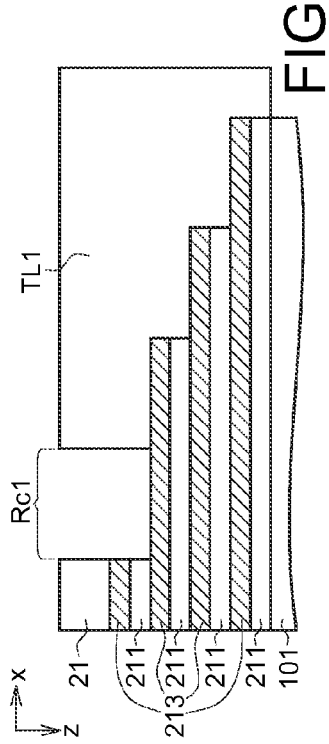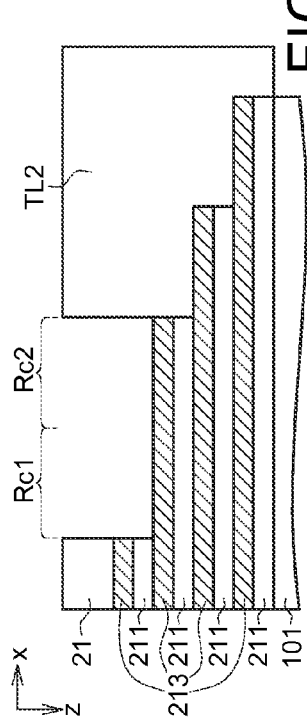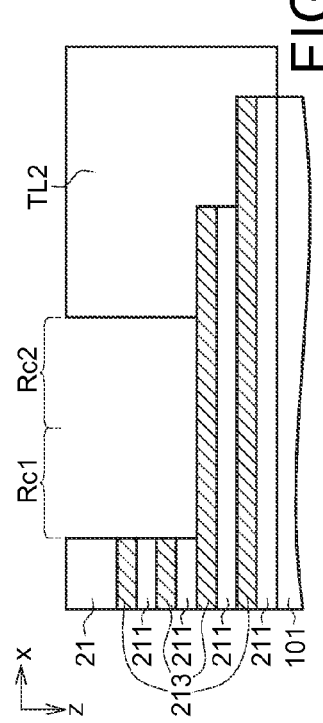

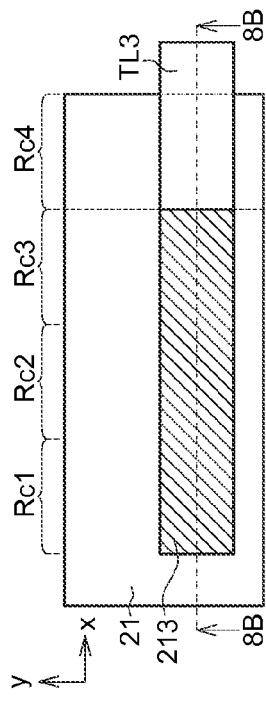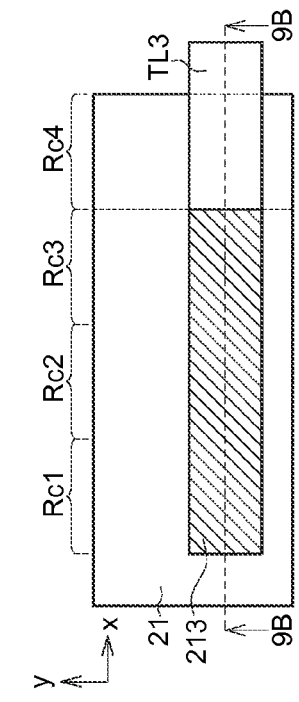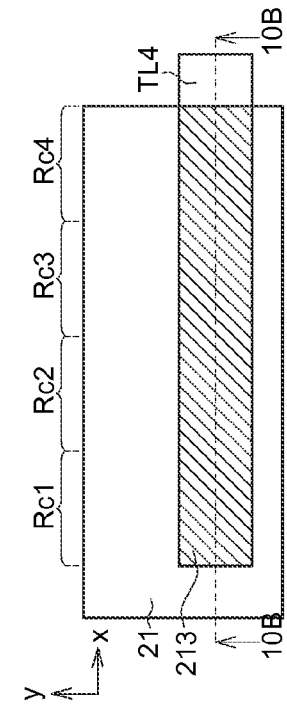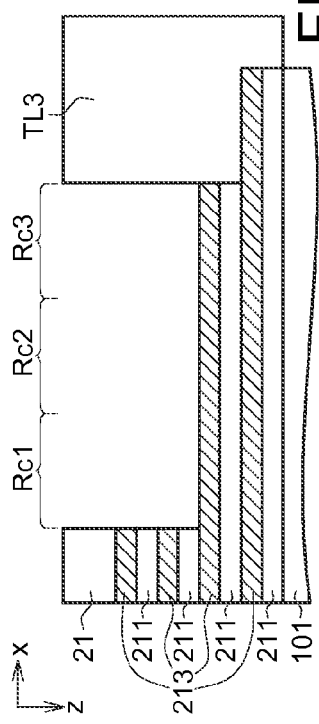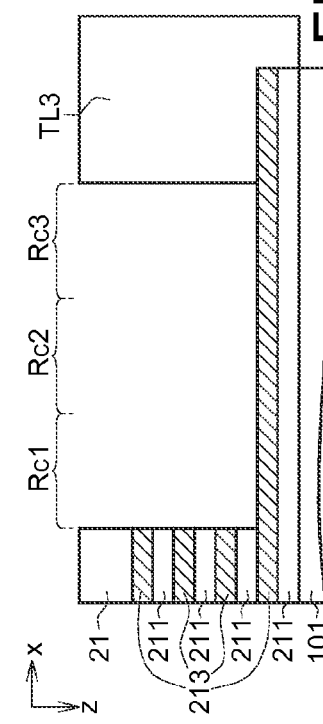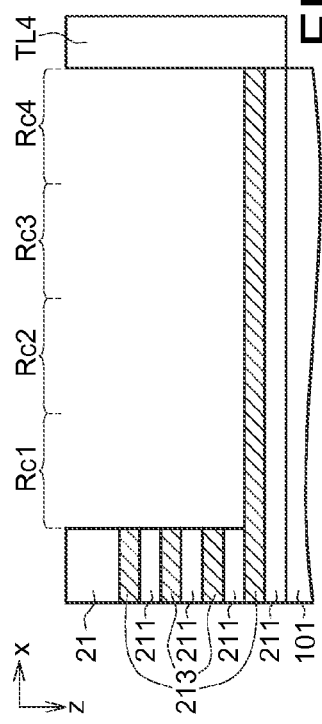

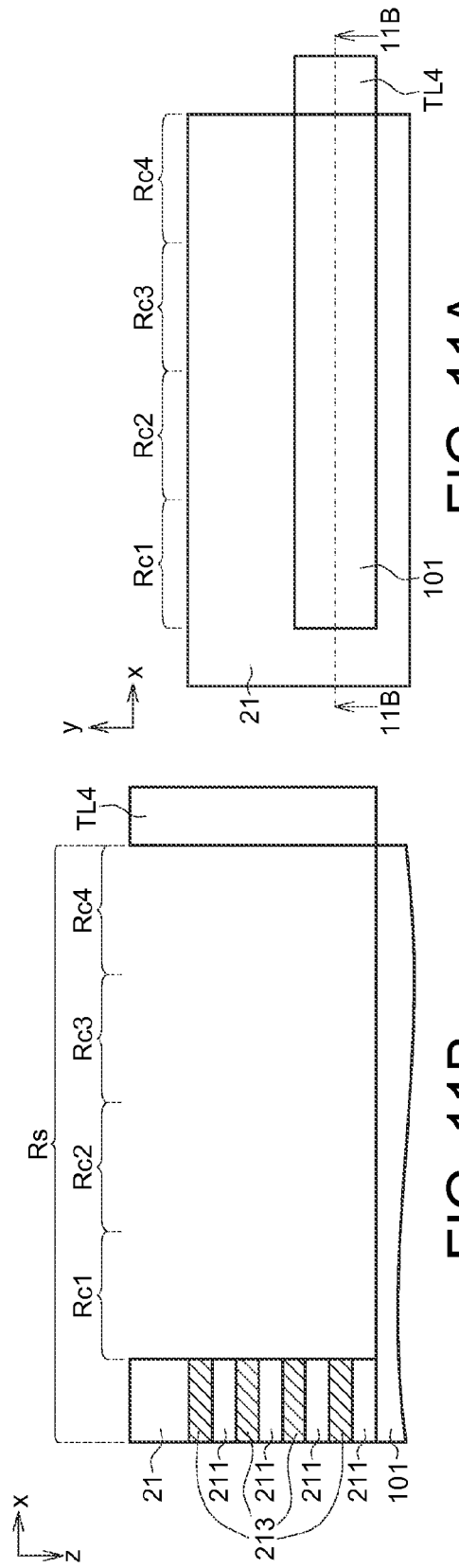

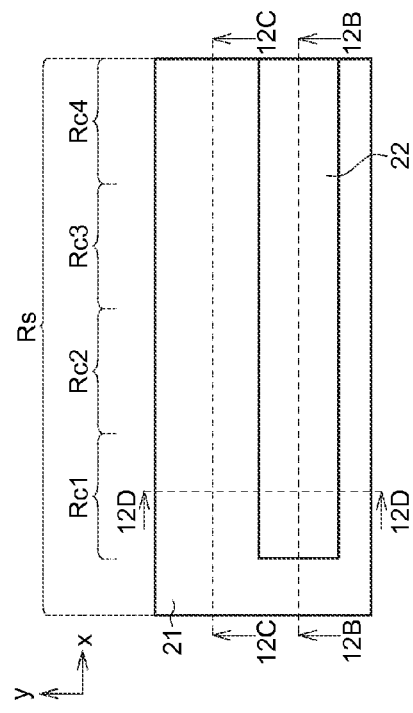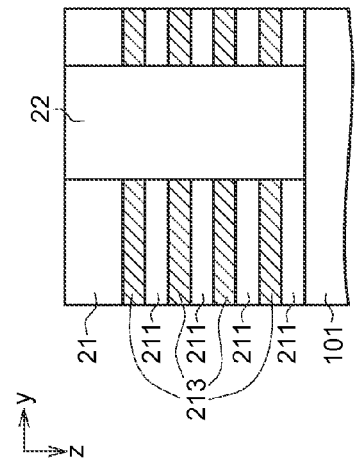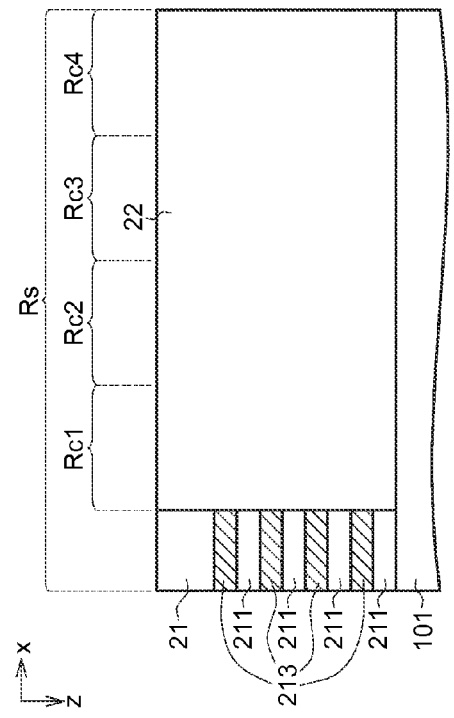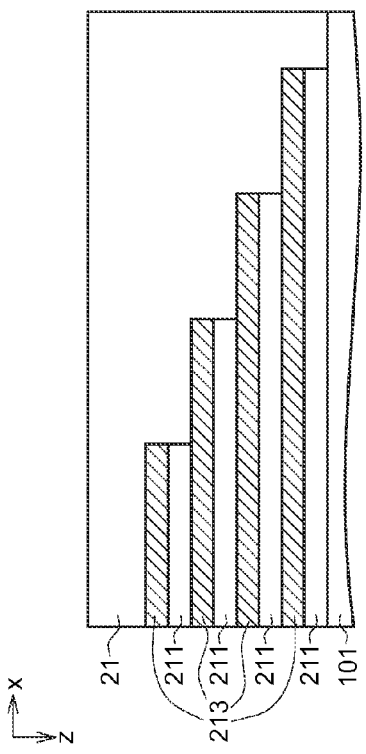
FIG. 12A
FIG. 12B
FIG. 12C
FIG. 12D

THREE-DIMENSIONAL SEMICONDUCTOR DEVICE AND METHOD OF MANUFACTURING THE SAME

BACKGROUND

1. Field of the Invention

The disclosure relates in general to a three-dimensional (3D) semiconductor device and a method of manufacturing the same, more particularly to a 3D semiconductor device with bottom contacts and a method of manufacturing the same.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed. Various semiconductor devices with three-dimensional (3D) stacked structures, having single-gate unit cells, double gate unit cells or surrounding gate unit cells, have been provided.

It is desirable to develop a semiconductor device with 3D stacked structure not only with larger number of multiple planes being stacked to achieve greater storage capacity, but also with memory cells having excellent electrical properties (such as reliability of data storage and speed of operation), so that the memory cells can be erased and programmed effectively. Typically, NAND Flash page size is proportional to the number of the bit lines (BL). Accordingly, when the device is scaled down, not only the decreased cost but also the increased read/write data rate are achieved due to the increasing of parallel operation, which leads to higher data rate. However, there are still other issues needed to be considered when the device is scaled down.

Take a 3D vertical channel (VC) semiconductor device (ex: NAND) for example, the X-pitch of the multilayered connectors can be relaxed by the wide staircase rule, but the Y-pitch would be very tight in order to connect the multilayered connectors to the word line decoder. Although enlarge block_Y may relax y-pitch, the number of the string selection line (SSL) will be increased, which induce more issues of power consumption and signal disturbance. Considering the serious disturbance mode in 3D NAND, less NSSL (number of SSL) design would be better choice for constructing the 3D device. However, this may induce high pattern density in the layer (WL) fan out area.

SUMMARY

The disclosure relates to a three-dimensional (3D) semiconductor device and a method of manufacturing the same. According to the embodied structures of the 3D semiconductor devices, the staircase contacts connected to the bottom under the multi-layers are provided, such as by directly extending the staircase contacts to the bottom, or forming top conductors connecting the staircase contacts and bottom contacts.

According to the present disclosure, a 3D semiconductor device is provided, comprising a substrate having a staircase region comprising N steps, wherein N is an integer one or greater; a stack having multi-layers on the substrate, and the multi-layers comprising active layers alternating with insulating layers on the substrate, the stack comprising a plurality of sub-stacks formed on the substrate and the sub-stacks disposed in relation to the N steps to form respective contact regions; and a plurality of connectors formed in the respective contact regions, and the connectors extending downwardly to connect a bottom layer under the multi-layers.

According to the present disclosure, a method of manufacturing a 3D semiconductor device is provided, comprising:

providing a substrate having a staircase region comprising N steps, wherein N is an integer one or greater;

forming a stack having multi-layers on the substrate, and the multi-layers comprising active layers (conductive layers) alternating with insulating layers on the substrate, and the stack comprising a plurality of sub-stacks formed on the substrate and the sub-stacks disposed in relation to the N steps to form respective contact regions; and forming a plurality of connectors in the respective contact regions, and the connectors extending downwardly to connect a bottom layer under the multi-layers.

The disclosure will become apparent from the following detailed description of the preferred but non-limiting embodiments. The following description is made with reference to the accompanying drawings.

BRIEF DESCRIPTION OF THE DRAWINGS

FIG. 2A is a top view of a portion of a 3D semiconductor device according to the first embodiment of the present disclosure.

FIG. 2B is a cross-sectional view of the 3D semiconductor device along the cross-sectional line 2B-2B of FIG. 2A.

FIG. 2C is a cross-sectional view of the 3D semiconductor device along the cross-sectional line 2C-2C of FIG. 2A.

FIG. 2D is a cross-sectional view of the 3D semiconductor device along the cross-sectional line 2D-2D of FIG. 2A.

FIG. 3A-FIG. 14D illustrate a method for manufacturing a 3D semiconductor devices with bottom contacts according to the first embodiment of the present disclosure.

DETAILED DESCRIPTION

The embodiments of the present disclosure disclosed below are for elaborating a three-dimensional (3D) semiconductor device, in particular, a 3D semiconductor device with bottom contacts. According to the embodiments, the bottom contacts are constructed in a 3D semiconductor device, and the flexibility in the range of applications would be increased. For example, the block selectors can be formed under the staircase contact region, and the 3D semiconductor device with bottom contacts of the embodiment is applicable for electrically connecting the block selectors under the staircase contact region and the multilayered connectors in the contact region, so that the area of the device can be decreased and the high density fan-out issue can be solved. Moreover, there are other situations for applying the bottom contacts of the embodiment, such as applications of 3D semiconductor devices having peripheryunder-array configuration, and/or staircase contact requiring inside array. The 3D semiconductor device with bottom contacts of the embodiment brings more possibilities for configurations of the devices pursuing high electrical performances and characteristics.

Figure 1:
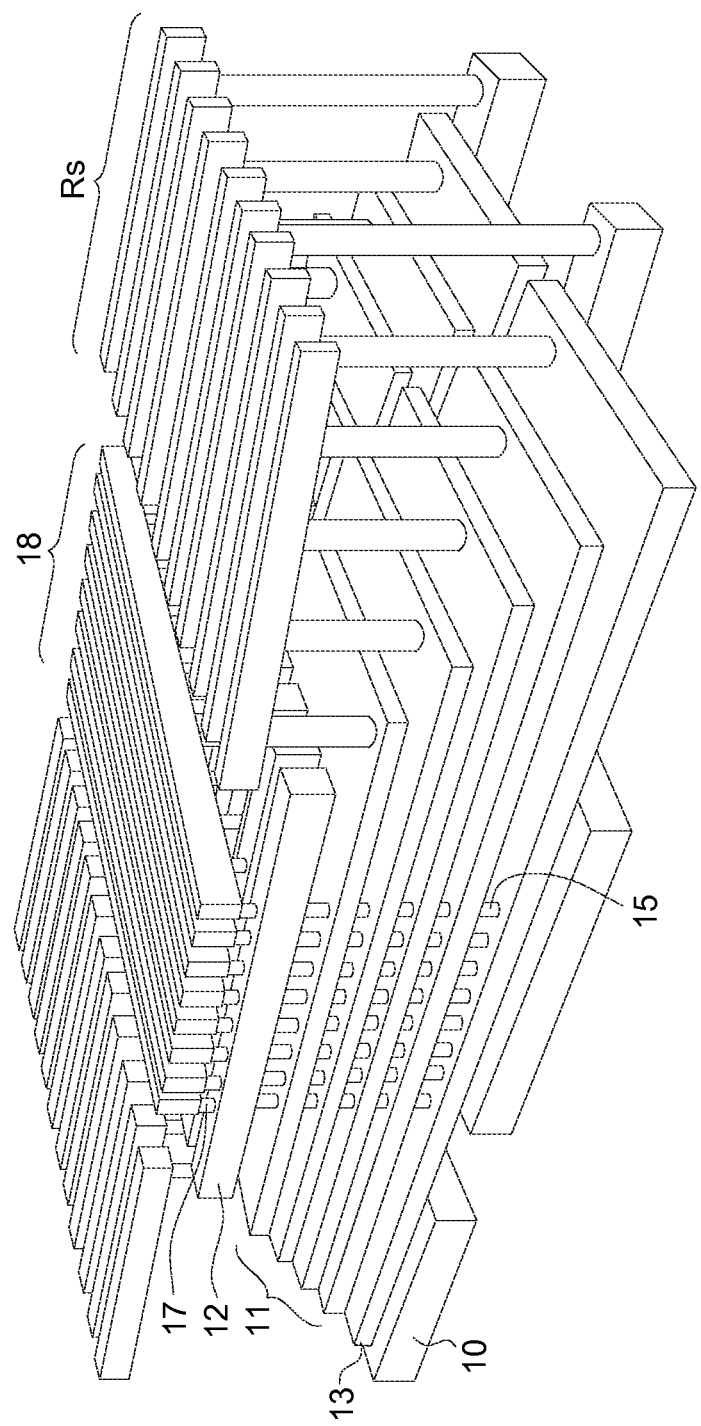
FIG. 1 shows a perspective view of a 3D semiconductor device.

The disclosure can be applied to various applications with different cell arrays of 3D semiconductor devices, such as vertical-channel (VC) 3D semiconductor devices and vertical-gate (VG) 3D semiconductor devices, and there are no particular limitations to the application types of 3D semiconductor devices. FIG. 1 shows a perspective view of a 3D semiconductor device. In FIG. 1, a VC 3D semiconductor device is illustrated for exemplification. A 3D semiconductor device comprises a stack having multi-layers on the substrate 10, and a staircase region Rs comprising N steps, wherein N is an integer one or greater. The multi-layers comprises a plurality of memory layers 11 (i.e. active layers; such as comprising control gates in the VC device) alternating with insulating layers on the substrate 10. The 3D semiconductor device further comprises a plurality of selection lines 12 disposed on the memory layers and parallel to each other; a plurality of strings 15 formed vertically to the memory layers 11 and the selection lines 12, wherein the strings 15 are electrically connected to the corresponding selection lines 12. Also, the 3D semiconductor device comprises a plurality of conductors 18 (such as bit lines BLs) disposed on the selection lines 12, and the conductors 18 are arranged in parallel to each other and in perpendicular to the selection lines 12. A plurality of cells, respectively defined by the strings 15, the selection lines 12 and the conductors 18 correspondingly, are arranged in a plurality of rows and columns to form a memory array. Also, a plurality of string contacts 17 are formed vertically to the memory layers 11 and the selection lines 12, and each of the string contacts 17 is disposed correspondingly at each of the strings 15 of the cells, wherein the string contacts 17 are electrically connected to the corresponding selection lines 12 and the corresponding conductors 18. The 3D semiconductor device may comprise other known elements; for example, the selection lines 12 are the upper select lines (upper SG), and the lower select lines (lower SG) 13 are further formed under the memory layers 11.

In the embodiment, the stack comprises a plurality of sub-stacks formed on the substrate 10, and the sub-stacks are disposed in relation to the N steps of the staircase region Rs to form respective contact regions (Rc). The embodied 3D semiconductor device further comprises a plurality of connectors formed in the respective contact regions (Rc), and the connectors extend downwardly to connect a bottom layer under the multi-layers. Two types of the 3D semiconductor devices with bottom contacts are exemplified below for illustration, but not for limitation, of the embodiments of the disclosure.

Embodiments are provided hereinafter with reference to the accompanying drawings for describing the related configurations and procedures, but the present disclosure is not limited thereto. The identical and/or similar elements of the embodiments are designated with the same and/or similar reference numerals. Also, it is noted that there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

First Embodiment

Please refer to FIG. 1 and FIG. 2A-FIG. 2D. FIG. 2A is a top view of a portion of a 3D semiconductor device according to the first embodiment of the present disclosure. FIG. 2B is a cross-sectional view of the 3D semiconductor device along the cross-sectional line 2B-2B of FIG. 2A. FIG. 2C is a cross-sectional view of the 3D semiconductor device along the cross-sectional line 2C-2C of FIG. 2A. FIG. 2D is a cross-sectional view of the 3D semiconductor device along the cross-sectional line 2D-2D of FIG. 2A. Also, FIG. 2A shows the 3D semiconductor device in a xy-plane, FIG. 2B and FIG. 2C show the 3D semiconductor devices in an xz-plane, and FIG. 2D show the 3D semiconductor device in an yz-plane.

In the embodiment, the sub-stacks of the stack formed on the substrate 10 are disposed in relation to the N steps of the staircase region Rs to form respective contact regions, such as the contact regions Rc1, Rc2, Rc3 and Rc4 as shown in FIG. 2A and FIG. 2B. In the first embodiment, the 3D semiconductor device further comprises a plurality of multilayered connectors such as 231, 232, 233 and 234 formed in the contact regions Rc1, Rc2, Rc3 and Rc4, respectively. According to the first embodiment, the bottom connectors such as 241, 242, 243 and 244 are formed in the respective contact regions and extend downwardly to connect the bottom layer 101 under the multi-layers (i.e. alternating active layers 213 and insulating layers 211) as shown in FIG. 2B.

As shown in FIG. 2C, the multilayered connectors such as 231, 232, 233 and 234 formed in the respective contact regions Rc1, Rc2, Rc3 and Rc4, are connected to landing areas on active layers 213 in each of the sub-stacks. For example, the multilayered connector 231 is connected to the landing area on the active layer 213 corresponding to the fourth step (of the staircase region Rs) in the contact region Rc1. Similarly, the multilayered connector 232 is connected to the landing area on the active layer 213 corresponding to the third step in the contact region Rc2, the multilayered connector 233 is connected to the landing area on the active layer 213 corresponding to the second step in the contact region Rc3, and the multilayered connector 234 is connected to the landing area on the active layer 213 corresponding to the first step in the contact region Rc4.

Please refer to FIG. 2A and FIG. 2D. In the first embodiment, each of the multilayered connectors such as 231, 232, 233 and 234 is electrically connected to each of the bottom connectors such as 241, 242, 243 and 244 by the top conductors such as 251, 252, 253 and 254 correspondingly. As shown in FIG. 2A, the multilayered connector 231 and the bottom connector 241 disposed adjacently are electrically connected by a top conductor 251. Similarly, the multilayered connector 232 and the bottom connector 242 disposed adjacently are electrically connected by a top conductor 252, the multilayered connector 233 and the bottom connector 243 disposed adjacently are electrically connected by a top conductor 253, and the multilayered connector 234 and the bottom connector 244 disposed adjacently are electrically connected by a top conductor 254. The top conductors 251, 252, 253 and 254 are isolated from each other.

In the first embodiment, the multilayered connectors (such as 231, 232, 233 and 234) and the bottom connectors (such as 241, 242, 243 and 244) are extended in parallel, and the extending direction, such as along the y-direction, of the top conductors (such as 251, 252, 253 and 254) are substantially perpendicular to the extending direction, such as along the z-direction, of the bottom connectors (such as 241, 242, 243 and 244), as shown in FIG. 2B to FIG. 2D.

Also, the multilayered connector and the bottom connector disposed adjacently are spaced apart by the insulator, such as the dielectric layers 21 and 22, as shown in FIG. 2D. The dielectric layers 21 and 22 can be made of the same material or different materials, and the disclosure has no limitation hereto. In one embodiment, a distance D between the multilayered connector and the bottom connector arranged adjacently (such as the multilayered connector 231 and the bottom connector 241 in FIG. 2D) is less than 5 μm. Other numerical values of the distance D may be applicable, depending on practical conditions of the 3D semiconductor device applications.

Additionally, the dielectric layer 22 surrounds the bottom connectors (such as 241, 242, 243 and 244) and covers the multi-layers. In one embodiment, a portion of the dielectric layer 22 surrounding one the bottom connectors (such the bottom connector as 241 in FIG. 2D) has a thickness S of 1 μm or less. Other numerical values of the thickness S may be applicable, depending on practical conditions of the 3D semiconductor device applications.

Also, as shown in FIG. 2D, the top conductors (such as 251, 252, 253 and 254) are formed on the dielectric layers 22 and 21 and connect the top surfaces of the multilayered connectors (such as 231, 232, 233 and 234) and the bottom connectors (such as 241, 242, 243 and 244). In other words, the top conductors (such as 251, 252, 253 and 254) for electrically connecting the multilayered connectors and the bottom connectors are separated and insulated from the active layers 213 of the multi-layers by the dielectric layers 22 and 21 according to the first embodiment.

In the 3D semiconductor device according to the embodiment, the bottom connectors (such as 241, 242, 243 and 244) as constructed are electrically connected to the corresponding circuit under the multi-layers. Examples the corresponding circuits include the block selectors such as TFTs, and elements for electrical communication of the periphery-under-array configuration, and elements for inside array configuration. Thus, the bottom contacts of the embodiment, which are coupled to multilayered connectors connected to landing areas on active layers in each of the sub-stacks, would bring more varieties for the development of the 3D semiconductor device constructions for improving the electrical performances and characteristics.

One of the methods of manufacturing the 3D semiconductor devices with bottom contacts according to the first embodiment are exemplified below for illustration. FIG. 3A-FIG. 14D illustrate a method for manufacturing a 3D semiconductor devices with bottom contacts according to the first embodiment of the present disclosure. Please also refer to FIG. 1 for the perspective view of related elements of the 3D semiconductor device of the embodiment.

Figure 3A:
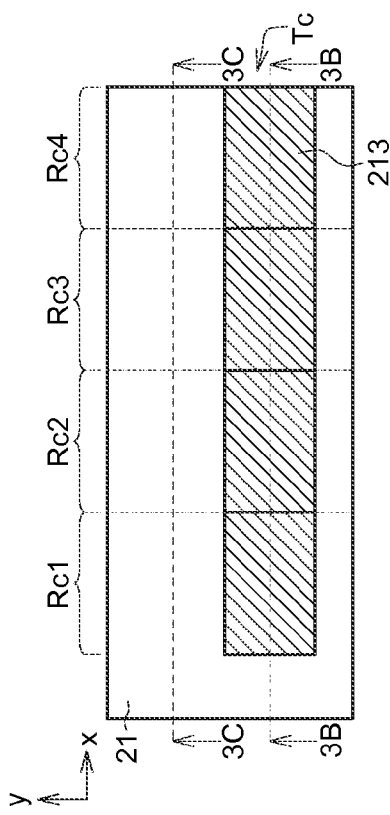
Figure 3B:
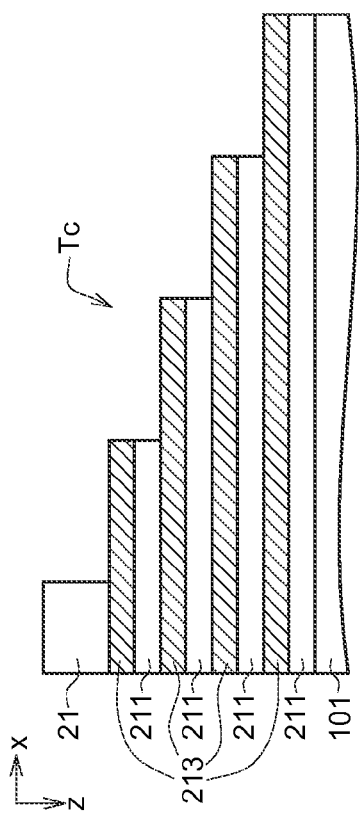
Figure 3C:
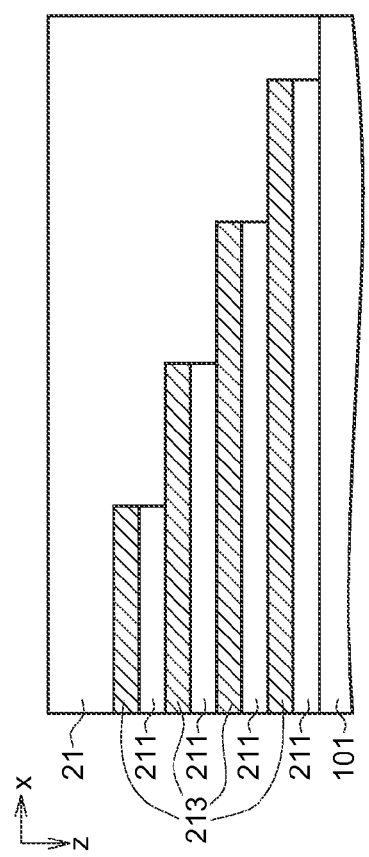

First, a stack having multi-layers on a substrate 10 is provided, and the multi-layers comprises the active layers (i.e. conductive layers) 231 alternating with insulating layers 211 on the substrate 10, and the stack comprises a plurality of sub-stacks formed on the substrate 10 and disposed in relation to the N steps of the staircase region Rs of the substrate 10 to form respective contact regions (such as Rc1 to Rc4), wherein N is an integer one or greater. Then, a dielectric layer 21 is deposited on a staircase Region Rs, and a trench area Tc is defined along the stairs as shown in FIG. 3A and FIG. 3B. Please refer to FIG. 3A, a top view of a portion of the 3D semiconductor device (in a xy-plane) showing the dielectric layer 21 and the active layers 213 of the N steps in the respective contact regions Rc1 to Rc4. FIG. 3B is a cross-sectional view of the 3D semiconductor device (in an xz-plane) along the cross-sectional line 3B-3B of FIG. 3A. FIG. 3C is a cross-sectional view of the 3D semiconductor device (in an xz-plane) along the cross-sectional line 3C-3C of FIG. 3A.

Afterwards, the multi-layers at the trench area Tc are removed, such as by a tri-layer process (ex: a tri-layer mask comprising the ODL/SHB/PR structure). In the embodiment, one pair layer (i.e. one active layer 213 and one insulating layer 211 for one of N steps) is etched, followed by trim etch process. Please refer to FIG. 4A-FIG. 4B to FIG. 11A-FIG. 11B. FIG. 4A-FIG. 11B depict a trim-etch process for removing the multi-layers at the trench area Tc of the 3D semiconductor device of the embodiment. Figures labeled with B such as FIGS. 4B, 5B, 6B, 7B, . . . 11B illustrate the cross-sectional views along the cross-sectional lines B-B (such as 4B-4B, 5B-5B, . . . 11B-11B) of Figures labeled with A, respectively. Also, it is assumed that the trim-etch of the dielectric layer 21 along the y-direction is ignored, since the height of the dielectric layer 21 is typically larger than the width (in y-direction) of the trench area Tc.

Figure 4A:
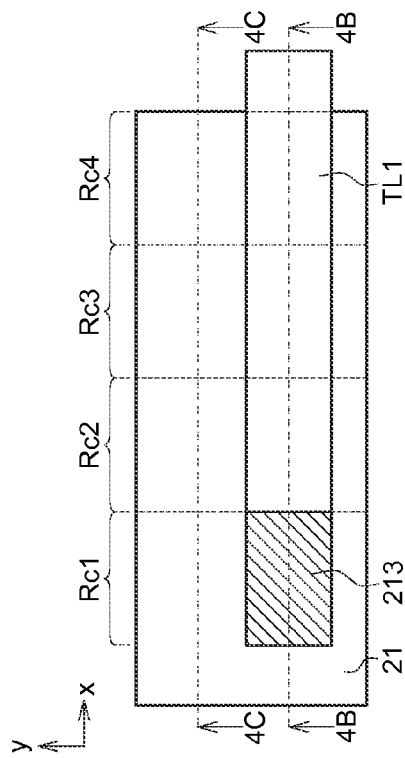
Figure 4B:
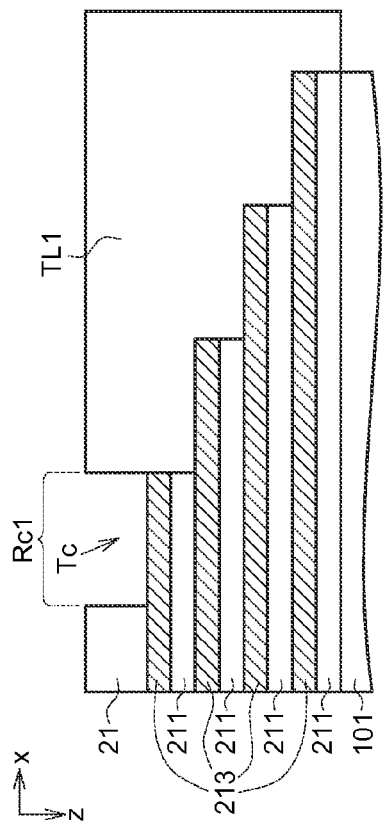
Figure 4C:
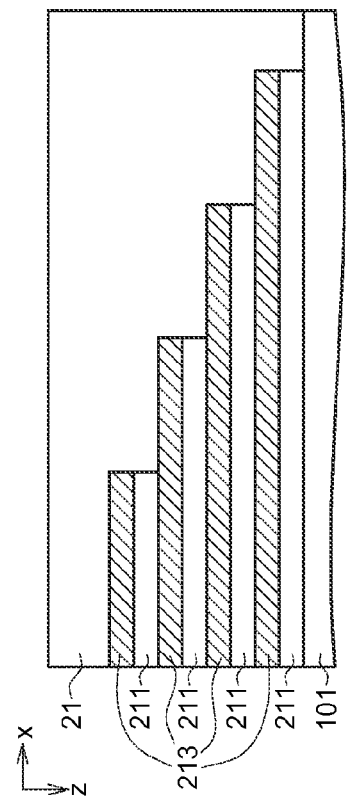

As shown in FIG. 4A and FIG. 4B, a tri-layered structure (ex: ODL/SHB/PR) TL1 is formed correspondingly to the trench area Tc at the contact region Rc1. As shown in FIG. 5A and FIG. 5B, the first pair layer (i.e. one active layer 213 and one insulating layer 211 for the first step of N steps, N=4) in the contact region Rc1 is etched using the tri-layered structure TL1, and the active layer 213 of the second pair layer (i.e. the active layer 213 and the insulating layer 211 for the second step of N steps, N=4) in the trench area Tc at the contact region Rc1 is exposed. Then, the tri-layered structure TL1 is trimmed to form the tri-layered structure TL2, and the active layer 213 of the second pair layer in the trench area Tc at the contact regions Rc1 and Rc2 is exposed, as shown in FIG. 6A and FIG. 6B.

Next, as shown in FIG. 7A and FIG. 7B, the second pair layer in the contact regions Rc1 and Rc2 is etched using the tri-layered structure TL2, and the active layer 213 of the third pair layer (i.e. the active layer 213 and the insulating layer 211 for the third step of N steps, N=4) in the trench area Tc at the contact regions Rc1 and Rc2 is exposed. Then, the tri-layered structure TL2 is trimmed to form the tri-layered structure TL3, and the active layer 213 of the third pair layer in the trench area Tc at the contact regions Rc1, Rc2 and Rc3 is exposed, as shown in FIG. 8A and FIG. 8B.

Next, as shown in FIG. 9A and FIG. 9B, the third pair layer in the contact regions Rc1, Rc2 and Rc3 is etched using the tri-layered structure TL3, and the active layer 213 of the fourth pair layer (i.e. the active layer 213 and the insulating layer 211 for the fourth step of N steps, N=4) in the trench area Tc at the contact regions Rc1, Rc2 and Rc3 is exposed. Then, the tri-layered structure TL3 is trimmed to form the tri-layered structure TL4, and the active layer 213 of the fourth pair layer in the trench area Tc at the contact regions Rc1, Rc2, Rc3 and Rc4 is exposed, as shown in FIG. 10A and FIG. 10B. Next, as shown in FIG. 11A and FIG. 11B, the fourth pair layer in the contact regions Rc1, Rc2, Rc3 and Rc4 is etched using the tri-layered structure TL4, and the multi-layers comprising active layers 213 alternating with insulating layers 211 in the trench area Tc at the contact regions Rc1, Rc2, Rc3 and Rc4 are completely removed.

After all the trim-etch processes are finished, a dielectric is deposited and filled in the trench area Tc, followed by a planarization process such as chemical-mechanical polishing (CMP) to planarize the top surface of the dielectric, so as to form the dielectric layer 22 as shown in FIG. 12A to FIG. 12D. FIG. 12A is a top view of a portion of the 3D semiconductor device (in a xy-plane) showing the dielectric layer 22 in the respective contact regions Rc1 to Rc4. FIG.

12B is a cross-sectional view of the 3D semiconductor device (in an xz-plane) along the cross-sectional line 12B-12B of FIG. 12A. FIG. 12C is a cross-sectional view of the 3D semiconductor device (in an xz-plane) along the cross-sectional line 12C-12C of FIG. 12A. FIG. 12D is a cross-sectional view of the 3D semiconductor device (in an yz-plane) along the cross-sectional line 12D-12D of FIG. 12A.

Figure 13A:
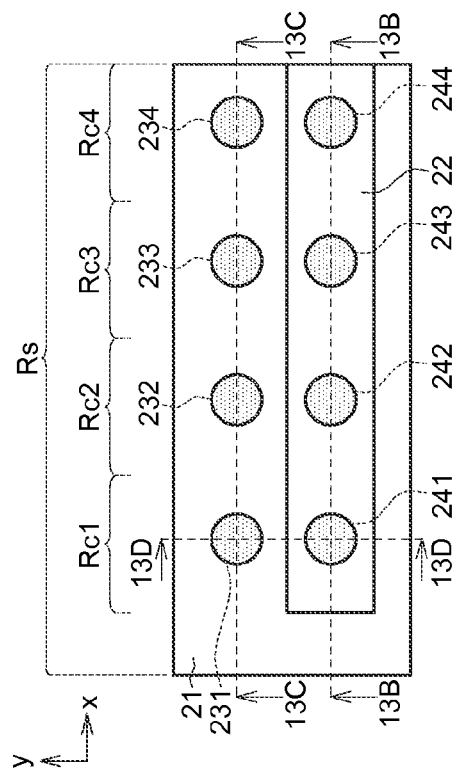
Figure 13B:
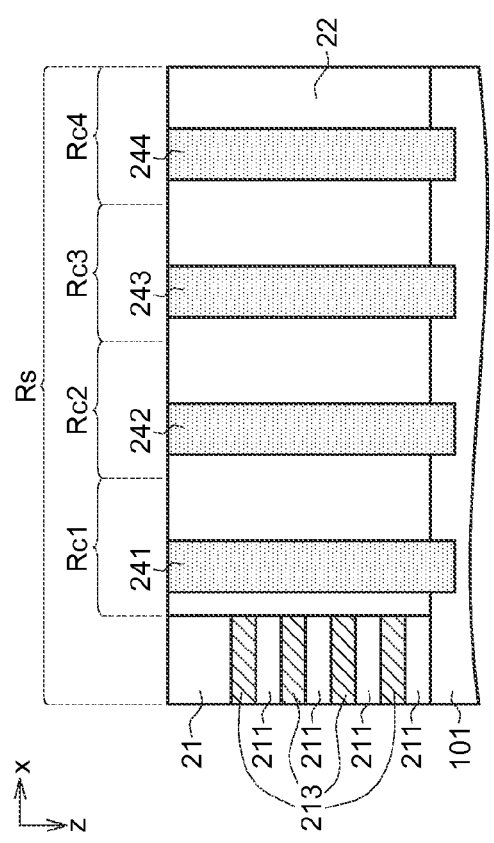
Figure 13D:
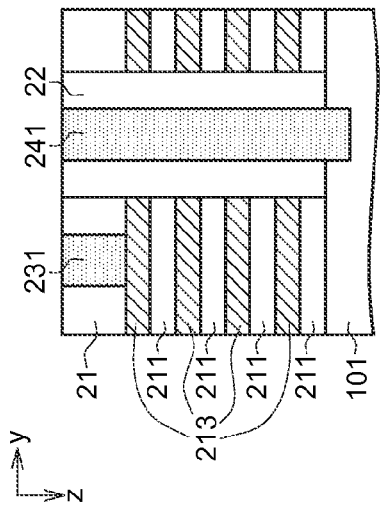
Figure 13C:
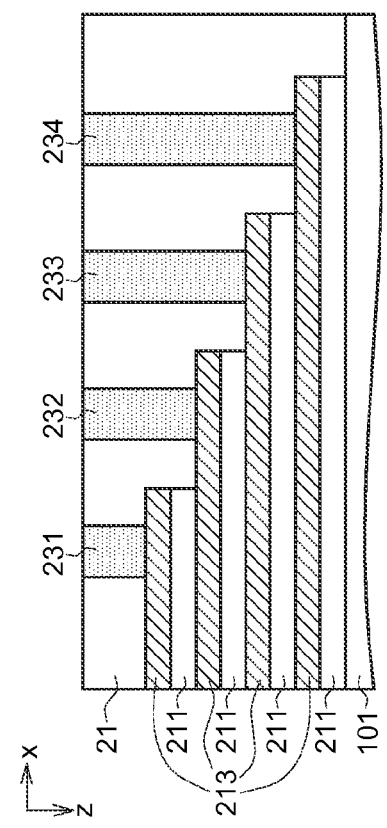

After formation of the dielectric layer 22, the contact process is conducted to form the multilayered connectors (such as 231, 232, 233 and 234) and the bottom connectors (such as 241, 242, 243 and 244) simultaneously, as shown in FIG. 13A to FIG. 13D. According to FIG. 13B and FIG. 13D, the bottom connectors (such as 241, 242, 243 and 244) formed in the respective contact regions (such as Rc1, Rc2, Rc3 and Rc4) extend downwardly to connect the bottom layer 101 under the multi-layers (i.e. alternating active layers 213 and insulating layers 211). The multilayered connectors (such as 231, 232, 233 and 234) formed in the respective contact regions (such as Rc1, Rc2, Rc3 and Rc4) are connected to landing areas on active layers 213 in each of the sub-stacks, as shown in FIG. 13C. Also, the multilayered connector (231/232/233/234) and the bottom connector (such as 241/242/243/244) disposed adjacently are spaced apart by the dielectric layers 21 and 22, as shown in FIG. 13D. The dielectric layers 21 and 22 can be made of the same material or different materials.

Figure 14A:
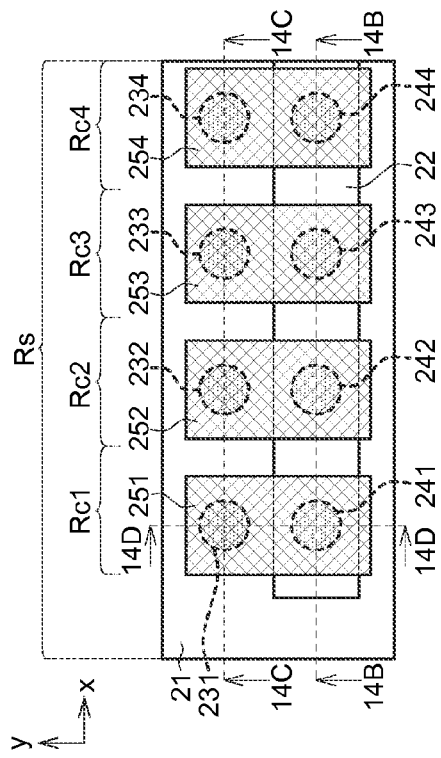
Figure 14B:
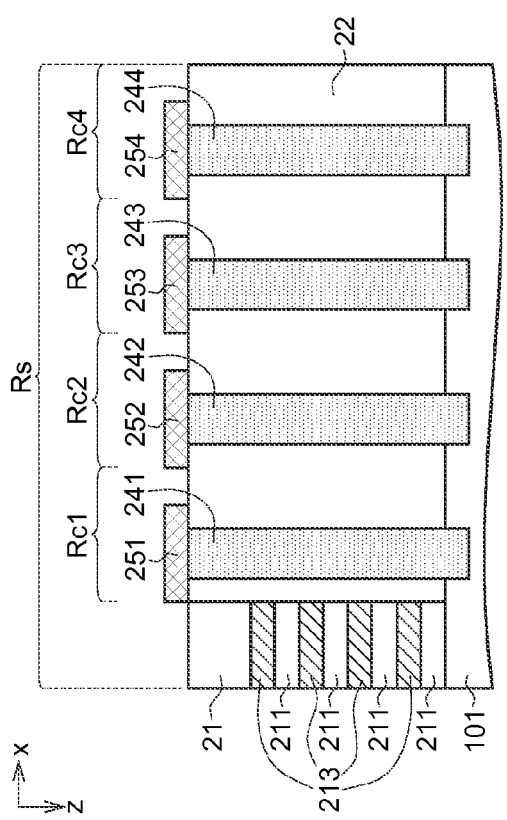
Figure 14D:
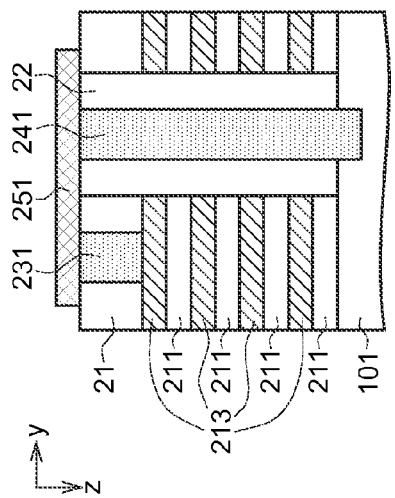
Figure 14C:
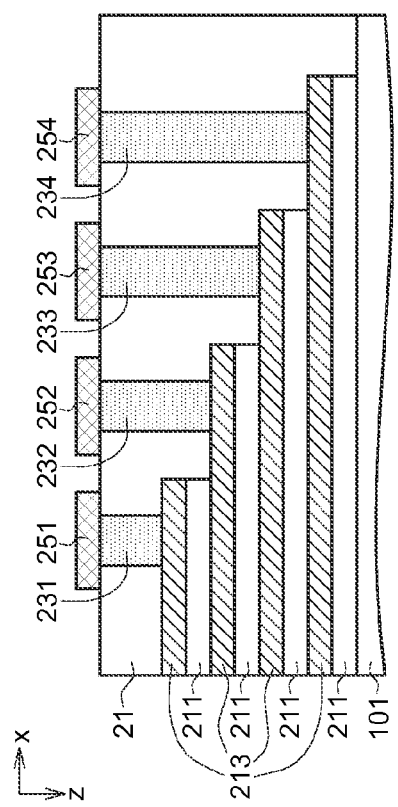

After contact process is finished, a conductive material (such as metal) deposition and patterning step are conducted to form the top conductors (such as 251, 252, 253 and 254), thereby implementing the top connection between the multilayered connector (231/232/233/234) and the bottom connector (such as 241/242/243/244) disposed adjacently, as shown in FIG. 14A to FIG. 14D. In the first embodiment, each of the multilayered connectors such as 231, 232, 233 and 234 is electrically connected to each of the bottom connectors such as 241, 242, 243 and 244 by the top conductors such as 251, 252, 253 and 254 correspondingly, as shown in FIG. 14D. Configuration of related elements in details are described above, and not redundantly repeated.

Second Embodiment

Figure 15:
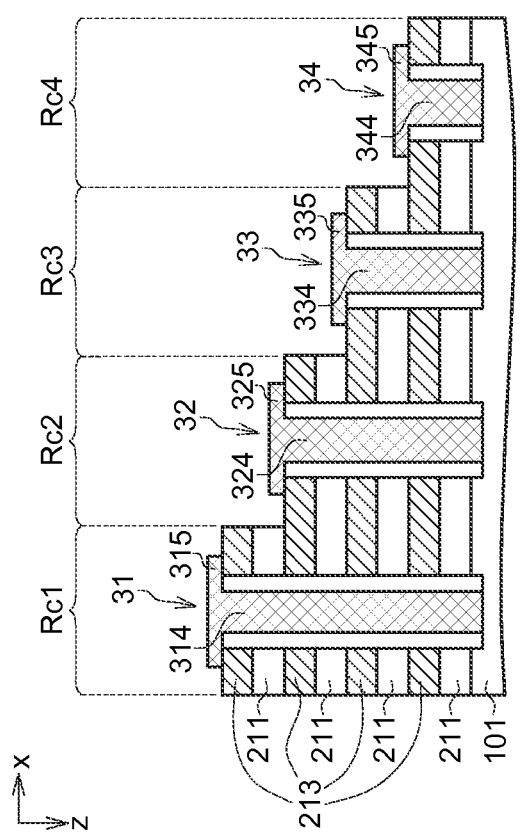
FIG. 15 is a cross-sectional view of a 3D semiconductor device according to the second embodiment of the present disclosure.

FIG. 15 is a cross-sectional view of a 3D semiconductor device according to the second embodiment of the present disclosure. According to the embodiment, the connectors formed in the respective contact regions extend downwardly to connect the bottom layer 101 under the multi-layers, wherein each of the connectors is electrically connected to multilayered connectors connected to landing areas on the active layers in each of the sub-stacks. According to the second embodiment, staircase contacts to the bottom are exemplified, and the connector (connecting the bottom layer 101 under the multi-layers) and the multilayered connector are formed as an integral piece.

As shown in FIG. 15, each of the connectors such as 31, 32, 33 or 34 comprises a first conductive portion such as 314, 324, 334 or 344 extending downwardly to connect the bottom layer 101, and a second conductive portion such as 315, 325, 335 or 345 connected to the first conductive portion. The second conductive portions such as 315, 325, 335 and 345 are electrically connected to the landing area on the active layers 213 (respectively of the first, second, third and fourth steps) in the corresponding sub-stacks. In FIG. 15, the first conductive portions 314, 324, 334 and 344 and the second conductive portions 315, 325, 335 and 345 form four of the integral pieces, respectively.

According to the second embodiment, the second conductive portion (such as 315/325/335/345) of the connector (such as 31/32/33/34) directly contacts the landing area on the active layer 213 in the sub-stack correspondingly. Also, the first conductive portion (such as 314/324/334/344) is separated from the active layers 213 of the multi-layers by the dielectric layer Ld, as shown in FIG. 15.

In one embodiment, an extending direction (ex: along z-direction) of the first conductive portion (such as 314/324/334/344) is substantially perpendicular to an extending direction (ex: along x-direction) of the second conductive portion (such as 315/325/335/345). In one embodiment, the first conductive portion (such as 314/324/334/344) penetrates the multi-layers and connects a conductor (ex: a circuit wired in the bottom layer 101) under the multi-layers.

One of the methods of manufacturing the 3D semiconductor devices with bottom contacts according to the second embodiment are exemplified below for illustration. FIG. 16-FIG. 25 illustrate a method for manufacturing a 3D semiconductor devices with bottom contacts according to the second embodiment of the present disclosure. Please also refer to FIG. 1 for the perspective view of related elements of the 3D semiconductor device of the embodiment. Also, related elements of a stack having multi-layers on the substrate 10 as provided and the stack comprises a plurality of sub-stacks formed on the substrate 10 and disposed in relation to the N steps of the staircase region Rs of the substrate 10 to form respective contact regions (such as Rc1 to Rc4) have been described in the first embodiment, and those details are not redundantly repeated herein. Please also refer to FIG. 3A and FIG. 3B. FIG. 16-FIG. 25 may be related to the cross-sectional views of the 3D semiconductor device along the cross-sectional lines 3B-3B of FIG. 3A. The manufacturing steps of FIG. 16-FIG. 25 would be performed in the trench area Tc as defined along the stairs shown in FIG. 3A and FIG. 3B.

Figure 17:
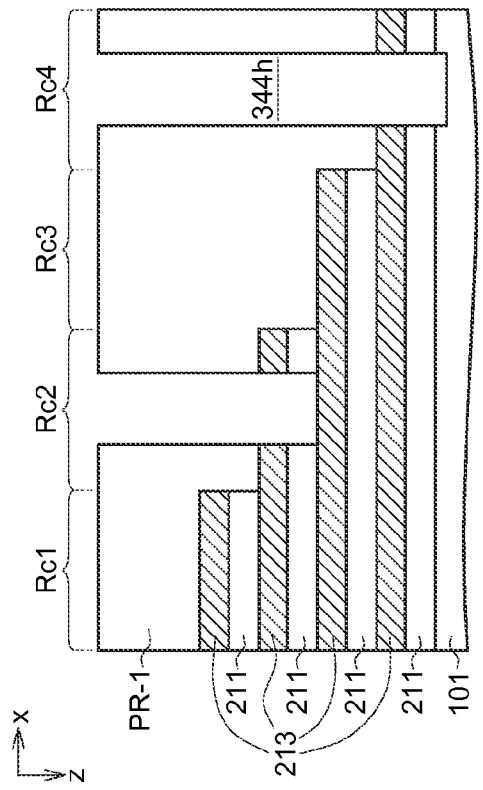
FIG. 16-FIG. 25 illustrate a method for manufacturing a 3D semiconductor devices with bottom contacts according to the second embodiment of the present disclosure.
Figure 16:
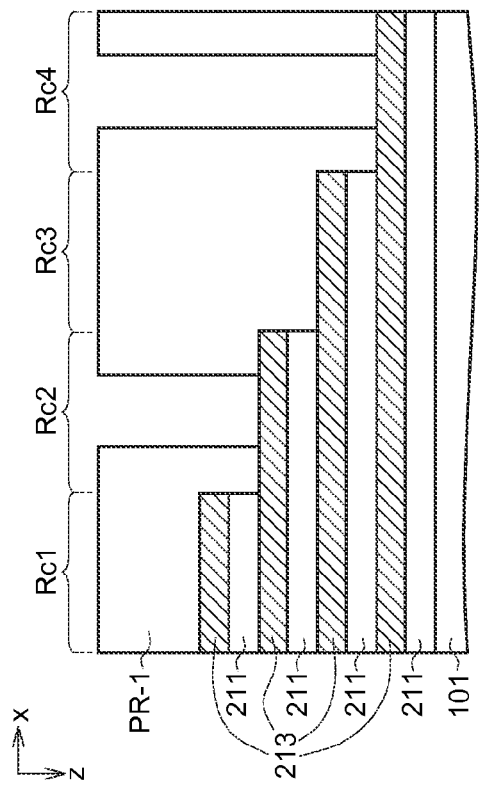

Please refer to FIG. 16 and FIG. 17, which show the first patterning procedure according to the method of the second embodiment. A patterned photoresist PR-1 (or patterned hardmask) is formed as shown in FIG. 16, wherein two holes corresponding to the active layers 213 of the second step and the fourth step (of N steps) are created simultaneously. Then, one pair layer (i.e. one active layer 213 and one insulating layer 211 for one of N steps) is etched as shown in FIG. 17, followed by PR-strip process. As shown in FIG. 17, the second pair layer (i.e. one active layer 213 and one insulating layer 211 for the second step of N steps, N=4) in the trench area Tc at the contact region Rc2, and the fourth pair layer (i.e. the active layer 213 and the insulating layer 211 for the fourth step of N steps, N=4) in the trench area Tc at the contact region Rc4 are etched simultaneously using the patterned photoresist PR-1. In FIG. 17, a fourth bottom contact hole 344h is created.

Figure 19:
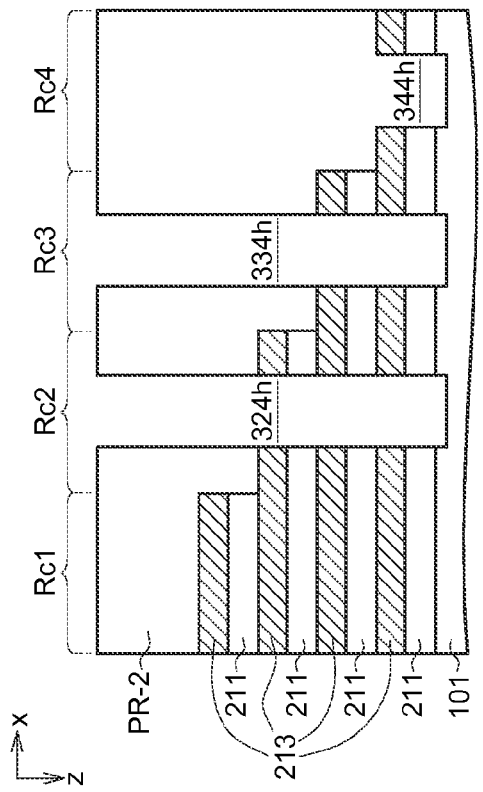
Figure 18:
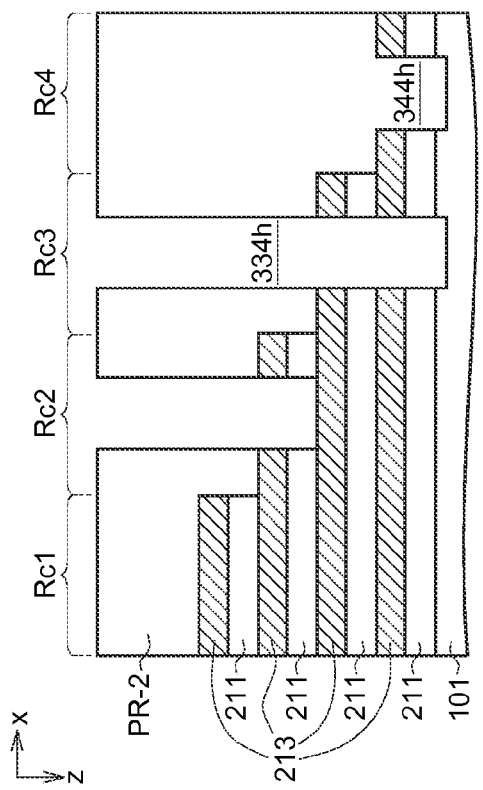

Please refer to FIG. 18 and FIG. 19, which show the second patterning procedure according to the method of the second embodiment. A patterned photoresist PR-2 (or patterned hardmask) is defined as shown in FIG. 18, wherein two holes corresponding to the active layers of the second step (of N steps) are created. Then, two pair layers (i.e. two active layers 213 and two insulating layers 211 for two of N steps) are etched as shown in FIG. 19, followed by PR-strip process. As shown in FIG. 19, three pair layers at the contact region Rc2 and two pair layers at the contact region Rc3 are removed. In FIG. 19, a second bottom contact hole 324h and a third bottom contact hole 334h are created.

Figure 20:
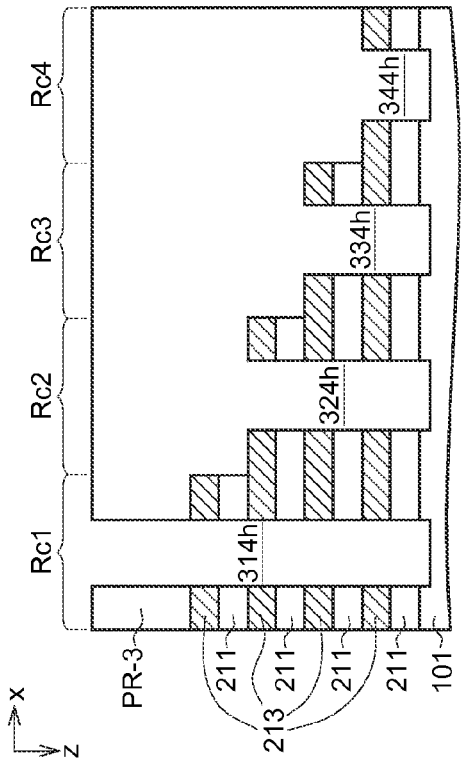
Figure 21:
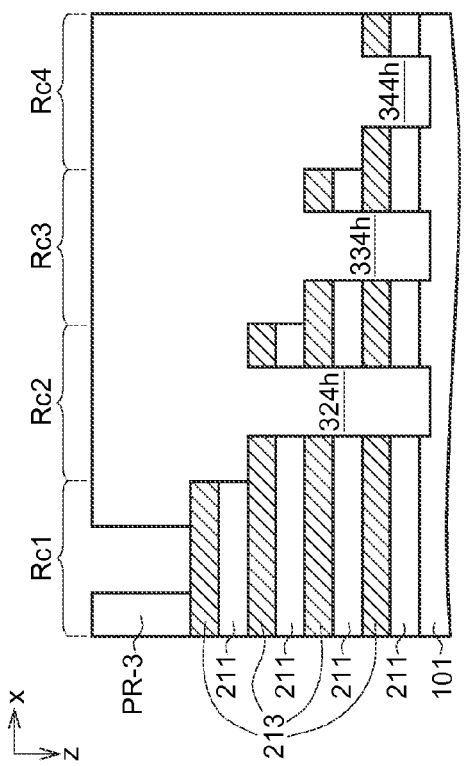

Please refer to FIG. 20 and FIG. 21, which show the third patterning procedure according to the method of the second embodiment. A patterned photoresist PR-3 (or patterned hardmask) is defined as shown in FIG. 20, wherein one hole corresponding to the active layer of the first step (of N steps) is created. Then, four pair layers are etched as shown in FIG. 21, followed by PR-strip process. As shown in FIG. 21, four pair layers at the contact region Rc1 are removed. In FIG. 21, a first bottom contact hole 314h is created. Four bottom contact holes (i.e. 314h, 324h, 334h and 344h) have been formed so far.

Figure 22:
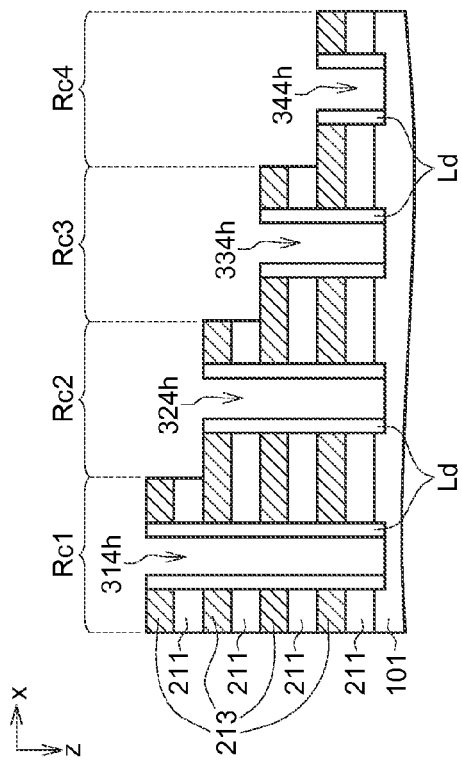

After four bottom contact holes are formed followed by PR-strip process, a dielectric is deposited (as a liner of the bottom contact hole) and etched to form the dielectric layer Ld as shown in FIG. 22. In FIG. 22, the top conductive layer (i.e. top active layer 213) is exposed, which facilitate the electric connection later.

Figure 23:
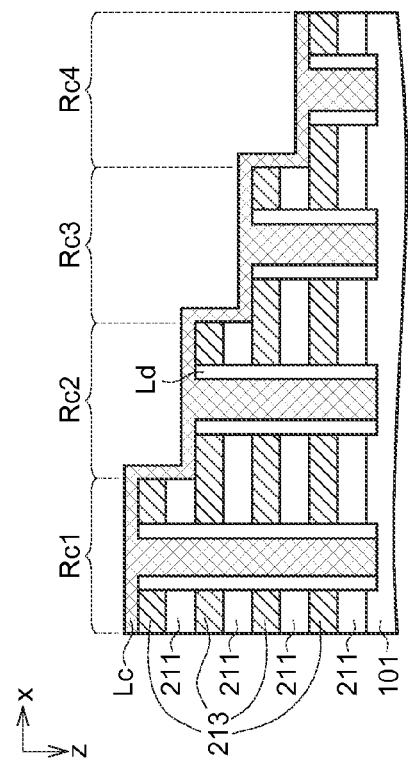
Figure 25:
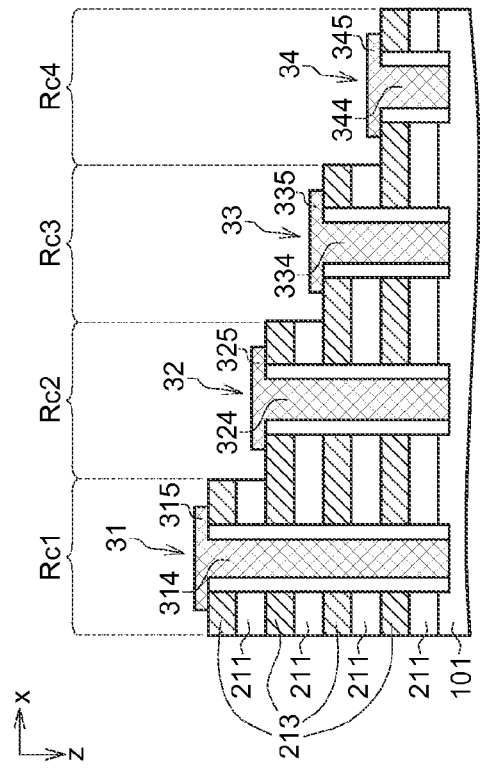
Figure 24:
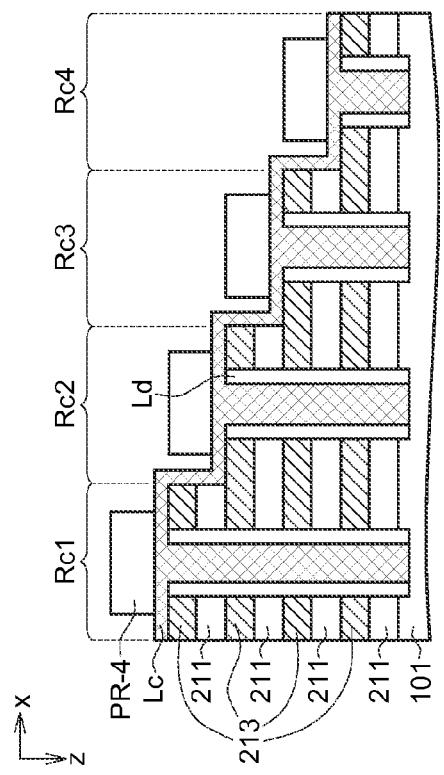

Then, a conductor Lc, such as TiN/W or doped silicon, is deposited and filling into the first to fourth bottom contact holes 314h-334h, as shown in FIG. 23. Afterward, a patterned photoresist PR-4 (or patterned hardmask) is defined as shown in FIG. 24, followed by isotropic etch, so as to remove the connecting portions of the conductor uncovered by the patterned photoresist PR-4. After PR-4 strip, the target structure as shown in FIG. 25 is obtained, which is also identical to the configuration of FIG. 15. In FIG. 25 (/FIG. 15), each connector (31/32/33/34) comprises a first conductive portion (314/324/334/344) extending downwardly to connect the bottom layer 101, and the second conductive portion (315/325/335/345) electrically connected to the first conductive portion and touches the landing area on the active layers 213 in the corresponding sub-stacks as multilayered contacts.

According to the aforementioned embodiments, the 3D semiconductor devices with bottom contacts are provided, by disposing the multilayered connectors and the bottom connectors adjacently and one for each electrically connected by a top conductor (i.e. the first embodiment), or forming the connectors having staircase contact portion and bottom contact portion (i.e. the second embodiment). The bottom contacts of the embodiments can be widely applied to different types of 3D semiconductor devices, such as VC-type and VG-type 3D semiconductor devices, and the multilayered films could be metal (metal gates), semiconductor (poly-gates or bit lines). There are no particular limitations to the application types of 3D semiconductor devices. It is noted that the cell arrays and staircase of the devices as described above are provided for illustration. The disclosure is not limited to the configurations disclosed above, and the exemplified structures could be adjusted and changed based on the actual needs of the practical applications. According to the structures of the 3D semiconductor devices as illustrated in the embodiments above, the flexibility in the range of applications has bee increased, and would brings more possibilities for configurations of the devices pursuing smaller size, easier fabrication, or more reliable electrical characteristics. Furthermore, the 3D semiconductor devices of the embodiments adopt no time-consuming and expensive manufacturing procedures, which is still suitable for mass production.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:
   a substrate having a staircase region comprising N steps, wherein N is an integer one or greater;
   a stack having multi-layers on the substrate, and the multi-layers comprising active layers alternating with insulating layers on the substrate, the stack comprising a plurality of sub-stacks formed on the substrate and the sub-stacks disposed in relation to the N steps of the staircase region to form respective contact regions; and
   a plurality of connectors formed in the respective contact regions, and each of the connectors comprising a first portion in each of the respective contact regions for extending downwardly and electrically connecting a bottom layer, and the bottom layer positioned under the multi-layers, and said each of the connectors also comprising a second portion adjacent to the first portion and electrically connecting a landing area on the corresponding active layer in each of the sub-stacks, wherein the first portions of the connectors are arranged along a first direction, the second portions of the connectors are arranged along a second direction in parallel to the first direction.

2. The 3D semiconductor device according to claim 1, wherein for the plurality of connectors, the second portions are multilayered connectors connected to the landing areas on the active layers in each of the sub-stacks correspondingly, and the second portion is electrically connected to the first portion in each of the contact regions.

3. The 3D semiconductor device according to claim 1, wherein the first portion of each of the connectors is a bottom connectors extending downwardly to connect the bottom layer under the multi-layers; and the second portion of each of the connectors is a multilayered connectors formed in the respective contact region for electrically connecting the landing area on the corresponding active layer in each of the sub-stacks.

4. The 3D semiconductor device according to claim 3, wherein each of the multilayered connectors is electrically connected to each of the bottom connectors in the corresponding contact region.

5. The 3D semiconductor device according to claim 4, wherein in said corresponding contact region, the multilayered connector and the bottom connector disposed adjacently are electrically connected by a top conductor.

6. The 3D semiconductor device according to claim 5, wherein the multilayered connectors and the bottom connectors are extended in parallel, and an extending direction of the top conductors is substantially perpendicular to an extending direction of the bottom connectors.

7. The 3D semiconductor device according to claim 5, wherein in said corresponding contact region, the multilayered connector and the bottom connector disposed adjacently are spaced apart by a dielectric layer.

8. The 3D semiconductor device according to claim 7, wherein the dielectric layer surrounds the bottom connectors and covers the multi-layers, and the top conductor in said corresponding contact region is formed on the dielectric layer and connects top surfaces of the multilayered connector and the bottom connector.

9. The 3D semiconductor device according to claim 1, wherein for each of the connectors, the first portion is a first conductive portion extending downwardly to connect the bottom layer; and the second portion is a second conductive portion electrically connected to the landing area on the corresponding active layer in the sub-stack, wherein the second conductive portion is electrically connected to the first conductive portion, and the first conductive portion and the second conductive portion are formed as an integral piece.

10. The 3D semiconductor device according to claim 9, wherein the first conductive portion is separated from the active layers of the multi-layers by a dielectric layer.

11. The 3D semiconductor device according to claim 9, wherein an extending direction of the first conductive portion is substantially perpendicular to an extending direction of the second conductive portion.

12. The 3D semiconductor device according to claim 9, wherein the second conductive portion of said connector directly contacts the landing area on the active layer in the sub-stack correspondingly.

13. The 3D semiconductor device according to claim 1, wherein at least one of the connectors is electrically connected to a circuit under the multi-layers.

14. A method of manufacturing a three-dimensional (3D) semiconductor device, comprising:
  providing a substrate having a staircase region comprising N steps, wherein N is an integer one or greater;
  forming a stack having multi-layers on the substrate, and the multi-layers comprising active layers alternating with insulating layers on the substrate, and the stack comprising a plurality of sub-stacks formed on the substrate and the sub-stacks disposed in relation to the N steps of the staircase region to form respective contact regions; and
  forming a plurality of connectors in the respective contact regions, wherein each of the connectors comprises a first portion in each of the respective contact regions for extending downwardly and electrically connecting a bottom layer, and the bottom layer is positioned under the multi-layers, and said each of the connectors also comprises a second portion adjacent to the first portion and electrically connecting a landing area on the corresponding active layer in each of the sub-stacks, wherein the first portions of the connectors are arranged along a first direction, the second portions of the connectors are arranged along a second direction in parallel to the first direction.

15. The method according to claim 14, wherein for the plurality of connectors, the second portions are multilayered connectors connected to the landing areas on the active layers in each of the sub-stacks correspondingly, and the second portion is electrically connected to the first portion in each of the contact regions.

16. The method according to claim 14, wherein the bottom layer positioned under the multi-layers is a conductor.

17. The method according to claim 14, wherein the first portion of each of the connectors is a bottom connector extending downwardly to connect the bottom layer under the multi-layers; and the second portion of each of the connectors is a multilayered connector in the respective contact region for electrically connecting to the landing area on the corresponding active layer in each of the sub-stacks,
  wherein each of the multilayered connectors is electrically connected to each of the bottom connectors in the corresponding contact region.

18. The method according to claim 17, wherein in said corresponding contact region, the multilayered connector and the bottom connector disposed adjacently are spaced apart by a dielectric layer and electrically connected by a top conductor.

19. The method according to claim 14, wherein in the step of forming the connectors, for each of the connectors, the first portion is a first conductive portion extending downwardly to connect the bottom layer; and the second portion is a second conductive portion electrically connected to the landing area on the corresponding active layer in the sub-stack,
  wherein the second conductive portion is electrically connected to the first conductive portion, and an extending direction of the first conductive portion is substantially perpendicular to an extending direction of the second conductive portion.

20. The method according to claim 19, further comprising:
  forming a dielectric layer to separate the first conductive portion from the active layers of the multi-layers,
  wherein the second conductive portion of said connector in said corresponding contact region is formed on top of the first conductive portion and directly contacts the landing area on the active layer in the sub-stack correspondingly.

* * * * *